United States Patent
Hedler et al.

(10) Patent No.: US 6,905,954 B2
(45) Date of Patent: Jun. 14, 2005

(54) METHOD FOR PRODUCING A SEMICONDUCTOR DEVICE AND CORRESPONDING SEMICONDUCTOR DEVICE

(75) Inventors: Harry Hedler, Germering (DE); Thorsten Meyer, Dresden (DE); Barbara Vasquez, Orinda, CA (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/634,242

(22) Filed: Aug. 5, 2003

(65) Prior Publication Data

US 2004/0070085 A1 Apr. 15, 2004

(30) Foreign Application Priority Data

Aug. 26, 2002 (DE) .......................... 102 39 081

(51) Int. Cl.[7] .............................................. H01L 21/44
(52) U.S. Cl. ..................... 438/612; 438/613; 257/779; 257/780
(58) Field of Search ................... 257/772, 779, 257/780, 781; 438/621, 614, 613, 612

(56) References Cited

U.S. PATENT DOCUMENTS 5,449,955 A    9/1995  Debiec et al.
6,569,752 B1 *  5/2003  Homma et al. ............. 438/597
6,639,314 B2 * 10/2003  Boettcher et al. ........... 257/736
6,696,356 B2 *  2/2004  Tseng et al. ................ 438/612
6,746,949 B2 *  6/2004  Bendal ....................... 438/612
6,767,819 B2 *  7/2004  Lutz .......................... 438/614
6,774,026 B1 *  8/2004  Wang et al. ................ 438/612

FOREIGN PATENT DOCUMENTS

| DE | 40 22 545      | 1/1992  |
| DE | 695 00 388     | 10/1997 |
| DE | 197 12 219     | 10/1998 |
| DE | 198 109 073    | 9/1999  |
| JP | 01257340       | 10/1989 |
| JP | 2000100821 A   | 7/2000  |
| JP | 2001217337 A   | 8/2001  |
| JP | 2001319994 A   | 11/2001 |
| JP | 2002009099 A   | 1/2002  |

* cited by examiner

Primary Examiner—S. V. Clark
(74) Attorney, Agent, or Firm—Jenkins, Wilson & Taylor, P.A.

(57) ABSTRACT

The present invention provides a method for producing a semiconductor device, with the steps of: applying an interconnect level (11, 12) to a semiconductor substrate (10); structuring the interconnect level (12); and applying a solder layer (13) on the structured interconnect level (11, 12) in such a way that the solder layer (13) assumes the structure of the interconnect level (11, 12). The present invention likewise provides such a semiconductor device.

18 Claims, 3 Drawing Sheets

METHOD FOR PRODUCING A SEMICONDUCTOR DEVICE AND CORRESPONDING SEMICONDUCTOR DEVICE

TECHNICAL FIELD

The present invention relates to a method for producing a semiconductor device and to a corresponding semiconductor device.

BACKGROUND ART

Semiconductor devices are usually either connected by means of an interposer substrate in a BGA (Ball Grid Array) on a printed circuit board or else the semiconductor device is connected directly on the printed circuit board as a WLP/CSP (Wafer Level Package/Chip Size Package).

In the case of a conventional BGA arrangement according to FIG. 4, a semiconductor device 10 is connected by means of solder balls 30 and a mechanical connecting device 31 to an interposer substrate 32 or a base. To protect the semiconductor device 10, it is surrounded by a cladding 33. Solder balls 30 serve in turn for the electrical bonding of the interposer substrate 32 onto a printed circuit board 34. As illustrated in FIG. 4 by the projection of an enlargement in the large oval, the bonding or the wiring takes place in or on the interposer substrate 32 by interconnects 35, for example of copper, which generally have a width of more than 100 $\mu$m and a height or thickness of more than 20 $\mu$m in the case of the printed circuit board technology illustrated. As a result, good electrical connection with low interconnect resistance is ensured, although this results in a high overall volume or large outer dimensions of the arrangement.

In FIG. 5, on the other hand, a conventional WLP/CSP arrangement is shown. In this case, the semiconductor device 10 or the semiconductor chip is connected by means of solder balls 30 directly to the printed circuit board 34. As in FIG. 4, in FIG. 5 the large oval is used to illustrate a detail of an enlargement, in which the semiconductor device 10 or the chip is represented with underlying electrical terminal contact devices 12. These contact or wiring devices 12 generally have a width of more than 20 $\mu$m and a height of approximately 2 to 4 $\mu$m, which are applied [sic] using thin-film technology.

Although the arrangement according to FIG. 5 allows a more compact construction without the additional interposer substrate, with this arrangement there is a disadvantage in that the conductivity of the wiring device of the WLP/CSP is lower by a factor of 5 to 10 than the conductivity of a conventional BGA with an interposer according to FIG. 4. In the case of a WLP arrangement, the resistance of the wiring device is high in comparison with the BGA alternative, for which reason the performance capability of the arrangement or the package is restricted, in particular in the case of high-frequency applications.

Represented in FIG. 6 is the cross section of a conventionally produced semiconductor device with a contact or wiring device. On a semiconductor substrate 10 of a chip or wafer there is firstly applied a carrier layer 11, preferably of titanium or a titanium compound, which is adjoined by a conductive layer 12 or interconnect level, for example comprising copper. The conductive layer 12 is followed by a barrier layer 40, which comprises nickel in particular and prevents metal atoms, for example gold, of a protective layer 41 applied on top of it from diffusing into the conductive layer 12, for example of copper.

Such an interconnect device protected from above, for example as a contact or wiring device of a semiconductor device 10, is applied by various production steps involving sputtering and/or electrochemical depositing processes and structured by an etching process with a photochemically structured photomask. The height of such a sequence of layers is usually approximately 4 to 6 $\mu$m. Disadvantages of such an arrangement are not only the multiple layer generating processes, which cause expenditure of time and consequently costs, but also those attributable to the fact that the side walls of the layer arrangement of the semiconductor substrate 10 are not protected and are consequently exposed in particular to electrochemical corrosion. In particular, the laterally exposed conductive layer 12, preferably of copper, is exposed to corrosion, the individual layers forming a galvanochemical element, which has a tendency to undergo undesired chemical reactions.

The necessary layers and method steps for the production of such a terminal or wiring device are generally sputtering on of an adhesive or carrier layer 11, sputtering on of a copper carrier layer (not represented), carrying out of a photolithographic process for the structuring of the sputtered-on metallizations 11, depositing of a copper interconnect layer 12, depositing of a nickel layer as a barrier or buffer layer 40, depositing of a gold layer 41 as protection and, finally, removal of the structured photomask and etching of the carrier layer in regions in which the structured photomask was previously provided.

In such a sequence of layers, the conductivity is determined by the deposited or plated copper layer 12. An improvement in the conductivity means increasing the depositing or plating time, which is associated directly with the process or production costs. To realize the same high conductivity as in the case of a BGA connection according to FIG. 4, which has an interposer 32 or base, the depositing or plating costs for a CSP/WLP terminal or wiring device as illustrated in FIG. 6 or FIG. 5 would not be economical.

SUMMARY OF THE INVENTION

It is therefore the object of the present invention to provide a method for producing a semiconductor device and a corresponding semiconductor device which provides terminal or wiring devices with a very good or high conductivity which can be produced at low cost and provide small overall dimensions of the arrangement.

This object is achieved according to the invention by the method specified in claim 1 for producing a semiconductor device and by the semiconductor device according to claim 15.

The idea on which the present invention is based is essentially to provide a high conductivity by increasing the conduction cross section by applying a solder layer over terminal or wiring devices or lines, without a costly plating or depositing step to increase the thickness of the copper or the conducting cross section.

In the present invention, the problem mentioned at the beginning is solved in particular by applying to a semiconductor substrate which has a structured interconnect level on it a structured solder layer on the structured interconnect level to increase the conductive cross section.

Advantageous developments and improvements of the respective subject-matter of the invention can be found in the subclaims.

According to a preferred development, the interconnect level is applied in a sputtering process.

According to a further preferred development, the interconnect level which is applied comprises a metal, preferably copper and/or aluminum.

According to a further preferred development, the interconnect level is structured in a photolithographic process.

According to a further preferred development, the structured interconnect level provides on the semiconductor substrate a carrier or barrier layer, which preferably comprises titanium and is structured like the interconnect level.

According to a further preferred development, the structured solder layer is applied in a printing process and is distributed in a predetermined way by re-liquefing or reflowing of the solder.

According to a further preferred development, the solder layer is applied in a dip soldering process, in which the upper side of the semiconductor substrate provided with the structured interconnect level is dipped into a solder bath.

According to a further preferred development, the solder resist device is selectively applied over predetermined portions of the arrangement before the application of the solder layer.

According to a further preferred development, side walls of the structured interconnect level and/or of the carrier or barrier layer are wetted with solder.

According to a further preferred development, both solder traces and solder balls for the bonding of further semiconductor devices and/or a printed circuit board in the vertical direction are formed during the application of the solder layer, preferably in the same process step.

According to a further preferred development, after the application of the structured solder layer, a non-conductive plastic, preferably polymer, is applied in such a way that the tips of the solder balls for the vertical bonding protrude from the plastic, other solder structures being covered over.

According to a further preferred development, the applied polymer is only cured during or after the electrical bonding with a further semiconductor device and/or a printed circuit board in the vertical direction.

According to a further preferred development, the polymer is applied in a printing process.

According to a further preferred development, the conductive interconnect level is formed on the semiconductor substrate and/or contact devices such as bonding pads in a printing or stamping process with a highly reactive substance, which comprises at least one noble metal, such as preferably platinum or palladium.

BRIEF DESCRIPTION OF THE DRAWINGS

Exemplary embodiments of the invention are explained in more detail in the description which follows and are represented in the drawings, in which.

DETAILED DESCRIPTION OF THE INVENTION

Figure 1:
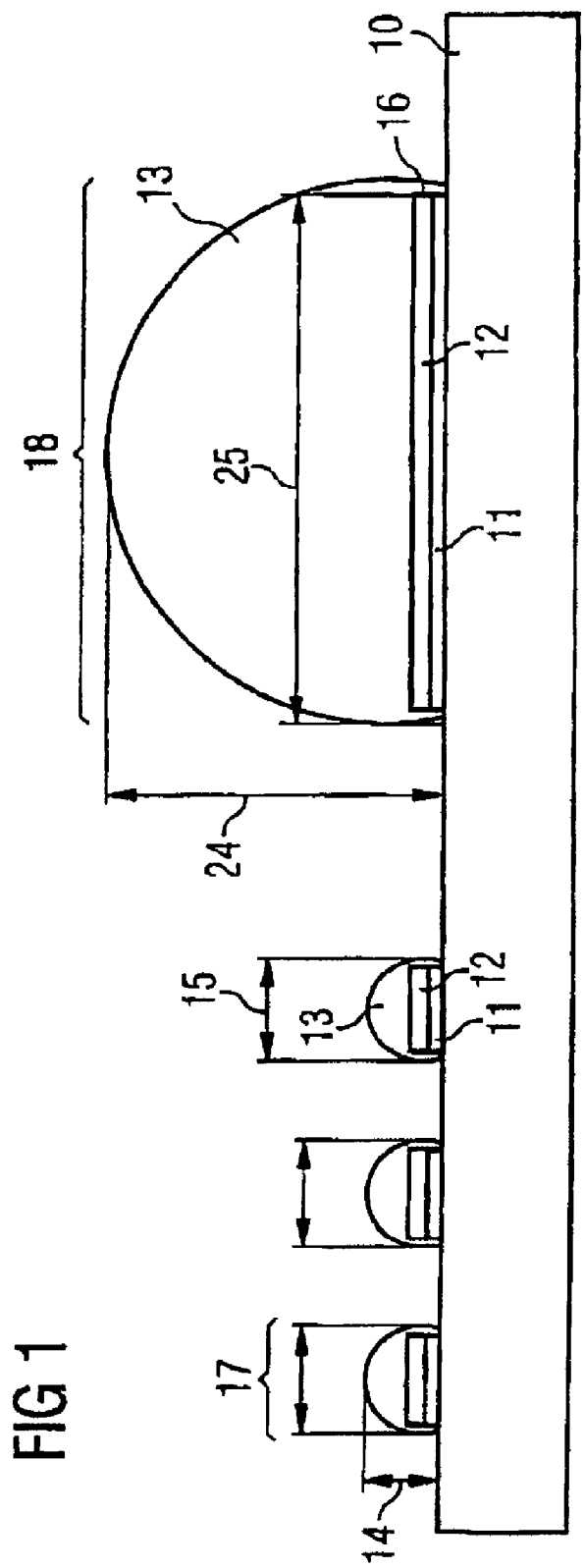
FIG. 1 shows the cross section of a semiconductor device produced according to an embodiment of the present invention.

In the figures, the same reference numerals designate components which are the same or functionally the same.

FIG. 1 shows a cross section of a semiconductor device produced according to an embodiment of the present invention.

Represented in FIG. 1 is a semiconductor substrate 10, to which a carrier layer 11, preferably of metal, such as for example titanium, has been applied in a sputtering process. A further metallization 12, which is likewise preferably sputtered on, for example of a conductive material, such as copper and/or aluminum, adjoins the carrier layer 11. A structured photomask is formed on this in a photolithographic method step by applying and exposing a photoresist, and in a subsequent etching step the applied metallization layers 11 and 12 is [sic] structured. This is followed by removal of the photoresist pattern or the photoresist mask and etching of the carrier layer.

Before a solder layer 13 is then applied to enlarge the conducting cross section of the structured, conductive layer 12 or the interconnect level 11, 12, it is possible, for example, for a soldering resist device or layer (not represented) to be selectively applied, in order to keep free predetermined portions on the structured interconnect level 11, 12.

To apply the solder layer 13 to the structured interconnect level 12, solder is applied to the structured interconnect level 11, 12 or the wiring devices 11, 12, for example in a printing process, and is distributed by re-liquefing in a reflow process. In this way, the electrically conductive solder can be applied at low cost and a cross-sectional enlargement of the conduction cross section of the structured interconnect level 12 can be provided.

The solder in the liquid state or in the reflow process preferably has a surface tension, which is chosen such that the height 14, 24 of a solder-wetted interconnect structure 11, 12 corresponds approximately to half the structure width 15, 25 of the interconnect structure. The solder 13 covers over or wets the side walls 16 of the structured interconnect level 11, 12 and preferably also of the carrier layer 11. Consequently, the side walls 16 are protected by the solder against electrochemical corrosion.

The vertical extent 14 of the solder over an interconnect structure 17 of the interconnect level 12 is adaptable to the required conductivity and preferably in the range between 10 to 25 μm in the case of a variable structure width of the interconnect portion 17 of the interconnect level 12 of, for example, approximately 20 to 50 μm. The height 24 of the solder structure or vertical extent of the solder on a terminal or connecting device 18 of the interconnect level 11, 12 is likewise adaptable to the required conductivity and preferably amounts to approximately 150 to 300 μm and the width 25 of the solder structure or horizontal extent of the solder on a terminal or connecting device 18 of the interconnect level 12 amounts, for example, to approximately 300 to 600 μm.

Instead of applying the solder 13 in a printing process with subsequent re-liquefying of the solder 13 and consequently distribution of the solder to predetermined portions of the interconnect level 12, wetting of the structured interconnect level 12 in a solder or soldering bath is alternatively envisaged. For this purpose, the semiconductor substrate 10 with the structured interconnect level 12 and/or the carrier layer 11, structured like the structured interconnect level 12, is preferably dipped with the metallized side downward into a soldering bath. The portions of the structured interconnect level 12 not provided with a soldering resist device (not represented) or soldering resist layer are then wetted with solder 13, the volume of the wetted solder 13 depending on the chosen surface tension of the solder in the liquid state and the dimensioning of the interconnect structure. Preferably only the structured interconnect level 12 and/or the similarly structured carrier layer 11 are dipped into the hot, liquid solder, while the semiconductor substrate 10 is not directly dipped into the soldering bath.

Figure 2:
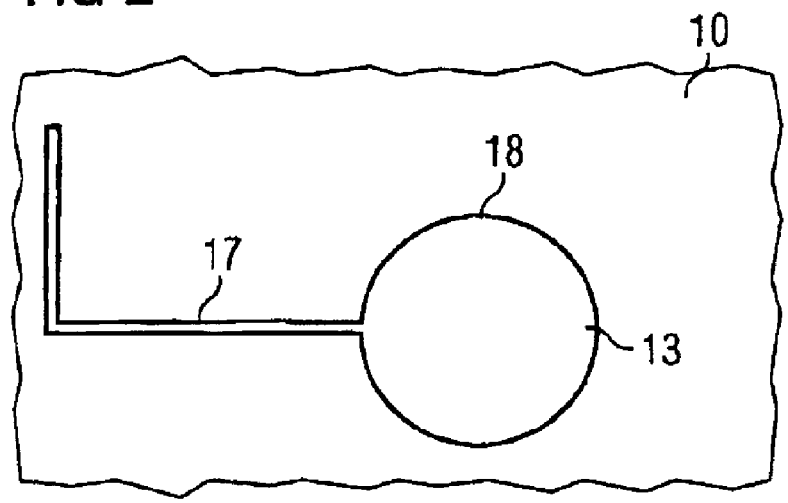
FIG. 2 shows a plan view of a detail for the explanation of an embodiment of the present invention.

FIG. 2 shows a plan view of a detail for the explanation of an embodiment of the present invention.

Represented in FIG. 2 is an interconnect portion 17 wetted with solder 13 and a terminal or connecting device 18, likewise wetted with solder 13, on the semiconductor substrate 10.

Figure 3:
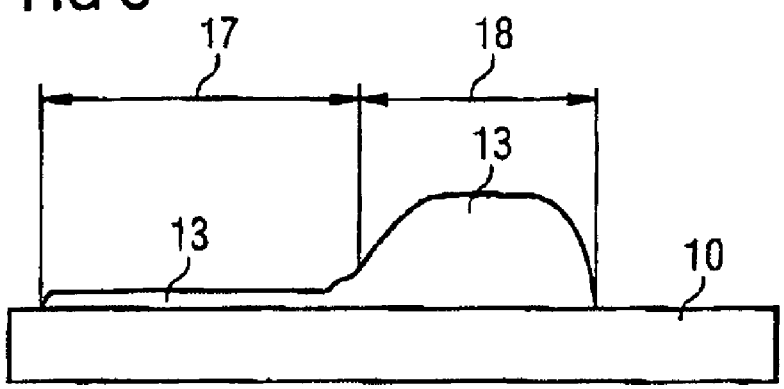
FIG. 3 shows a cross-sectional view of the device according to FIG. 2.
Figure 6:
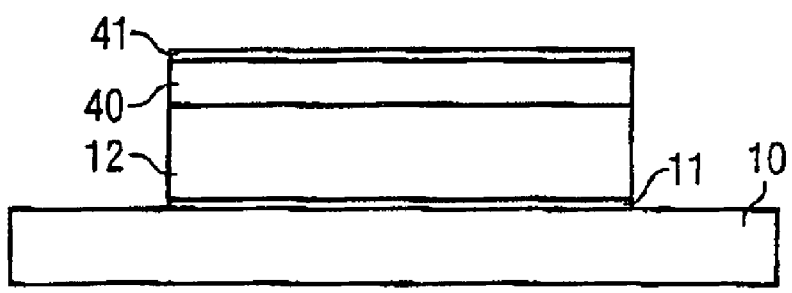
FIG. 6 shows the cross section of a semiconductor device produced by a customary method.
Figure 4:
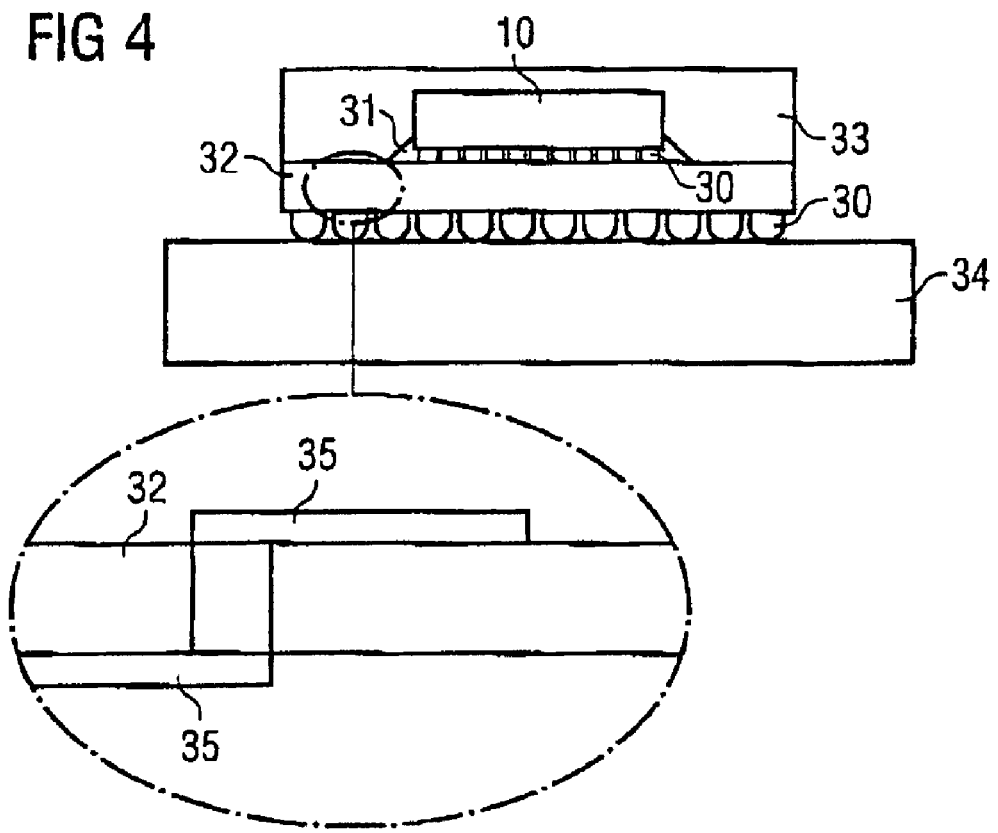
FIG. 4 shows the cross section of a customary semiconductor device with a projection of an enlargement.
Figure 5:
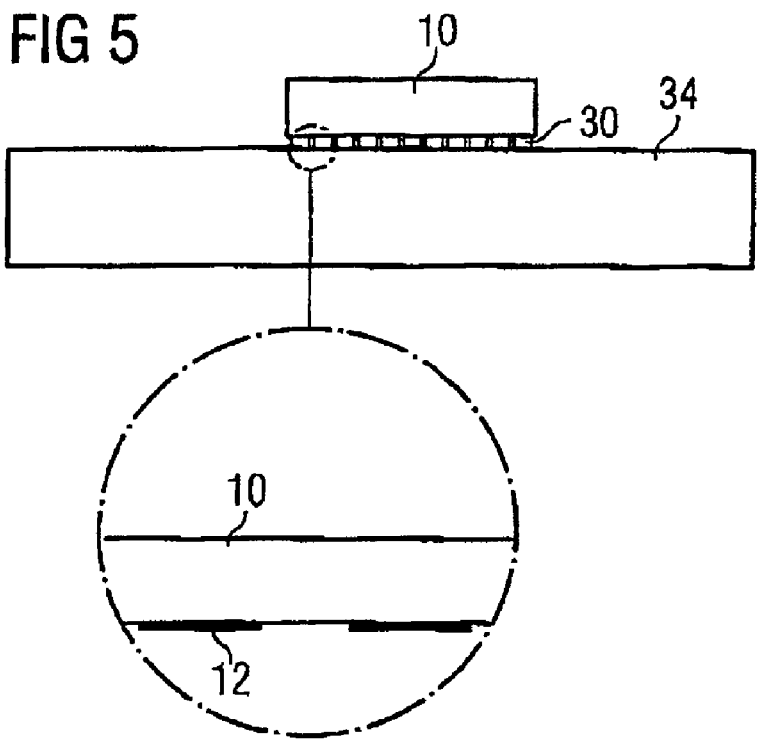
FIG. 5 shows the cross section of a known semiconductor device with a projection of an enlargement.

In FIG. 3, the arrangement according to FIG. 2 is illustrated in cross section. On the semiconductor substrate 10, a wetting with solder 13 is provided both in the interconnect portion 17 and in the terminal or connecting device portion 18. On account of the greater horizontal extent of the terminal device 18, as represented in FIG. 2, in the region of the vertical bonding device 18, which is intended for connecting further semiconductor devices and/or a printed circuit board, according to FIG. 3 a higher vertical extent of the solder also results in this portion.

The semiconductor device according to the invention, for example according to FIG. 1, may additionally be provided with a filling polymer applied on the wafer level, which is applied in a printing or distributing process after the reflowing of the solder and thereby preferably encapsulate [sic] the solder structures that are shorter in their vertical extent, such as for example the interconnect portions 17 wetted with solder, on the wiring devices 12 and embed [sic] the solder balls, which are provided in particular for vertical bonding, without covering them over, so that the tip of the solder ball protrudes above the filling material. This filling device is then activated during the re-liquefying of the solder balls for the vertical bonding of further semiconductor devices and/or a printed circuit board and consequently adheres to the additional semiconductor device and/or the printed circuit board, whereby a solid mechanical connection is ensured between, for example, the printed circuit board and the chip.

Instead of the carrier layer 11 and/or the interconnect level 12 being sputtered on, the connecting devices or portions 18 (bonding pads), for example of aluminum, and the passivation of the semiconductor chip may be activated simultaneously by printing or impressing with chemicals which comprise highly reactive components such as noble metals, such as Pt or Pd. The structure produced in this way both over the aluminum of a bonding pad and over the passivation of the semiconductor substrate is wetted by solder. In the case of this method, the applied carrier metallization is very thin, avoiding the cost-intensive photolithographic steps which are required for structuring the carrier metallization interconnects.

Although the present invention has been described above on the basis of preferred exemplary embodiments, it is not restricted to this, but instead can be modified in various ways.

Although actual dimensioning proposals for interconnect structures or bonding devices have been made in the exemplary embodiments, both larger and smaller structures are conceivable. In addition, the envisaged materials, for example for the interconnect level or the possibly present carrier layer, are to be understood as given by way of example.

What is claimed is:

1. Method for producing a semiconductor device with the steps of:

(a) applying an interconnect level to a semiconductor substrate;
(b) structuring the interconnect level;
(c) applying a solder layer on the structured interconnect level in such a way that the solder layer assumes the structure of the interconnect level, so that the vertical extent of the solder layer corresponds to an interconnect structure of the interconnect level; and
(d) applying after the application of the structured solder layer, a non-conductive plastic polymer, in such a way that the tips of the solder balls for the vertical bonding protrude from the plastic, other solder structures being covered over.

2. Method according to claim 1, wherein the interconnect level is applied in a sputtering process or in a depositing process without external current.

3. Method according to claim 1, wherein the interconnect level which is applied comprises a metal, preferably copper and/or nickel and/or aluminum.

4. Method according to claim 1, wherein the interconnect level is structured with the aid of a photolithographic process.

5. Method according to claim 1, wherein a carrier layer which preferably comprises titanium and is structured like the interconnect level is applied on the semiconductor substrate.

6. Method according to claim 1, wherein the solder layer is applied in a printing process and is distributed in a predetermined way by re-liquefying or reflowing of the solder.

7. Method according to claim 1, wherein the solder layer is applied in a dip soldering process, in which the upper side of the semiconductor substrate provided with the structured interconnect level is dipped into a solder bath.

8. Method according to claim 1, wherein a solder resist layer is selectively applied on predetermined portions of the arrangement after the structuring of the interconnect level and before the application of the solder layer.

9. Method according to claim 1, wherein side walls of the structured interconnect level and/or of the carrier layer are wetted with solder.

10. Method according to claim 1, wherein both solder traces and solder balls for the bonding of further semiconductor devices and/or a printed circuit board in the vertical direction are formed during the application of the solder layer, preferably in the same process step.

11. Method according to claim 1, wherein the applied polymer is only cured during or after the electrical bonding with a further semiconductor device and/or a printed circuit board in the vertical direction.

12. Method according to claim 1, wherein the polymer is applied in a printing process.

13. Method according to claim 1, wherein the conductive interconnect level is formed on the semiconductor substrate and/or contact devices such as bonding pads in a printing or stamping process with a highly reactive substance, which comprises at least one noble metal, such as preferably platinum or palladium.

14. Semiconductor device with:

(a) a semiconductor substrate;
(b) a structured interconnect level on the semiconductor substrate;
(c) a solder layer on the structured interconnect level for enlarging the conductive cross section, the solder layer assuming the structure of the interconnect level, so that the vertical extent of the solder layer corresponds to an interconnect structure of the interconnect level; and (d) wherein the structured solder layer has a solder layer height which corresponds approximately to half the structure width of the structured interconnect level.

15. Semiconductor device according to claim 14, wherein the structured interconnect level comprises a metal, in particular aluminum and/or copper.

16. Semiconductor device according to claim 14, wherein the structured interconnect level provides on the semiconductor substrate a carrier layer, which is structured like the interconnect level and preferably comprises titanium and/or copper.

17. Semiconductor device according to claim 14, wherein side walls of the structured interconnect level and/or of the carrier layer are wetted with solder.

18. Semiconductor device according to claim 14, wherein the semiconductor device is mechanically connected to at least one further semiconductor device and/or a printed circuit board by means of a plastic or a polymer, the electrical connection being provided in the vertical direction by means of solder balls.

* * * * *